(12) United States Patent
Davidson et al.

(10) Patent No.: US 6,362,615 B1
(45) Date of Patent: Mar. 26, 2002

(54) ELECTRO-OPTIC VOLTAGE SENSOR FOR SENSING VOLTAGE IN AN E-FIELD

(75) Inventors: James R. Davidson; Thomas M. Crawford; Gary D. Seifert, all of Idaho Falls, ID (US)

(73) Assignee: Bechtel BWXT Idaho LLC, Idaho Falls, ID (US)

(*) Notice: Subject to any disclaimer, the term of this patent is extended or adjusted under 35 U.S.C. 154(b) by 0 days.

(21) Appl. No.: 09/386,937

(22) Filed: Aug. 31, 1999

Related U.S. Application Data
(60) Provisional application No. 60/098,794, filed on Sep. 1, 1998.

(51) Int. Cl.[7] .............................. G01R 15/24; G02F 1/00
(52) U.S. Cl. ......................................... 324/96; 324/750
(58) Field of Search ................................ 324/750, 751, 324/752, 96, 244.1, 501; 250/227.23; 356/370, 368, 400; 359/322, 251, 257; 385/12

(56) References Cited

U.S. PATENT DOCUMENTS

| | | | |
|---|---|---|---|
| 3,466,541 A | * 9/1969 | Bernard et al. | 324/96 |
| 5,059,894 A | * 10/1991 | Miller | 324/96 |
| 5,113,131 A | * 5/1992 | Cooper et al. | 324/96 |
| 5,153,427 A | * 10/1992 | Takahashi et al. | 250/231.1 |
| 5,892,357 A | * 4/1999 | Woods et al. | 324/96 |

* cited by examiner

Primary Examiner—Vinh P. Nguyen
(74) Attorney, Agent, or Firm—Thorpe North & Western

(57) ABSTRACT

A miniature electro-optic voltage sensor and system capable of accurate operation at high voltages has a sensor body disposed in an E-field. The body receives a source beam of electromagnetic radiation. A polarization beam displacer separates the source light beam into two beams with orthogonal linear polarizations. A wave plate rotates the linear polarization to rotated polarization. A transducer utilizes Pockels electro-optic effect and induces a differential phase shift on the major and minor axes of the rotated polarization in response to the E-field. A prism redirects the beam back through the transducer, wave plate, and polarization beam displacer. The prism also converts the rotated polarization to circular or elliptical polarization. The wave plate rotates the major and minor axes of the circular or elliptical polarization to linear polarization. The polarization beam displacer separates the beam into two beams of orthogonal linear polarization representing the major and minor axes. The system may have a transmitter for producing the beam of electro-magnetic radiation; a detector for converting the two beams into electrical signals; and a signal processor for determining the voltage.

22 Claims, 5 Drawing Sheets

ELECTRO-OPTIC VOLTAGE SENSOR FOR SENSING VOLTAGE IN AN E-FIELD

CONTRACTUAL ORIGIN OF THE INVENTION

The present application claims priority from co-pending United States Provisional Patent Application Ser. No. 60/098,794, entitled "Electro-Optic Voltage Sensor," filed on Sep. 01, 1998.

BACKGROUND OF THE INVENTION

1. Field of the Invention The present invention relates generally to an electro-optic high voltage sensor for sensing and/or measuring an E-field produced by an energized conductor. More particularly, it concerns an electro-optic voltage sensor which utilized the Pockels electro-optic effect to measure voltage.

2. Background Art

High-accuracy measurement of high voltage has traditionally been accomplished using iron-core ferro-magnetic potential transformers. These devices have substantially limited dynamic range, bandwidth, linearity, and electrical isolation. During electrical fault conditions these transformers can conduct dangerous levels of fault energy to downstream instrumentation and personnel, posing an additional liability.

A variety of optic sensors for measuring voltage have been developed in attempts to offer the power industry an alternative to the conventional transformer technology. Generally, these voltage sensor systems require that direct electrical contact be made with the energized conductor. This contact is made necessary by the use of a voltage divider which is utilized to connect the sensing element with the energized conductor on which a measurement is to be made. Direct electrical contact with the conductor may alter or interrupt the operation of the power system by presenting a burden or load.

In addition to the disadvantages associated with direct electrical contact with the energized conductor, prior art voltage sensor systems are typically bulky, particularly in extremely high voltage applications. This is true because the size of the voltage divider required is proportional to the voltage being measured. The size of such systems can make them difficult and expensive to install and house in substations.

Many prior art sensors are based upon the electrostrictive principle which utilize interferometric modulation principles. Unfortunately, interferometric modulation is extremely temperature sensitive. This temperature sensitivity requires controlled conditions in order to obtain accurate voltage measurements. The requirement of controlled conditions limits the usefulness of such systems and makes them unsuited for outdoor or uncontrolled applications. In addition, interferometric modulation requires a highly coherent source of electromagnetic radiation, which is relatively expensive.

Open-air E-field based sensors have also been developed, but lack accuracy when used for measuring voltage because the open-air E-field used varies with many noisy parameters including ambient dielectric constant, adjacent conductor voltages, moving conductive structures such as passing vehicles, and other electromagnetic noise contributions.

Systems which utilize mechanical modulation of the optical reflection within an optic fiber have also been developed. Among other drawbacks, the reliance of such systems on moving parts is a significant deterrent to widespread use.

U.S. Pat. No. 5,892,357, issued Apr. 6, 1999, and assigned to the same assignee of the present invention, discloses an electro-optic voltage sensor which may be disposed in an E-field between an energized conductor and a grounded conductor without contacting the energized conductor. The electro-optic voltage sensor utilizes a Pockles crystal or transducer which is sensitive to the E-field and induces a differential phase shift on a beam of electro-magnetic radiation traveling through the sensor in response to the E-field. Although the electro-optic voltage sensor solves many of the problems with the prior art, it still has some drawbacks. For example, the electro-optic voltage sensor disclosed in the above mentioned co-pending application utilizes a beam splitter to separate orthogonal polarization components of the electro-magnetic radiation. The beam splitter directs one component out of the sensor in one direction, for example along a longitudinal axis of the sensor, and directs the other component out a different direction, perpendicular to the longitudinal axis of the sensor. Therefore, either both components exit the sensor from different sides, making the sensor difficult to locate between the conductor and grounded conductor, or an additional reflector is required to direct the other component so both components exit the same side, making the sensor large.

It would therefore be an advantage in the art to provide a system which does not require direct electrical contact with the energized conductor, is compact, operates in a variety of temperatures and conditions, is reliable, and is cost effective.

OBJECTS AND SUMMARY OF THE INVENTION

It is therefore an object of the present invention to provide an electro-optic voltage sensor system which does not require contact with a conductor.

It is a flier object of the present invention to provide such an electro-optic voltage sensor system which is capable of use in a variety of environmental conditions.

It is a still further object of the present invention to provide such an electro-optic voltage sensor system which can be employed to accurately measure high voltages without use of dedicated voltage division hardware.

It is an additional object of the present invention to provide such an electro-optic voltage sensor system which minimizes the electronics needed for implementation.

It is a further object of the present invention to provide a sensor system capable of being integrated with existing types of high voltage power transmission and distribution equipment so as to reduce or eliminate the need for large stand-alone voltage measurement apparatus.

It is yet another object of the present invention to provide a sensor system capable of being integrated with existing types of power transmission and distribution equipment.

It is yet another object of the present invention to provide a sensor system with a sensor that is of small size.

While the present invention is described in terms of a sensor system, it is to be understood that the subject apparatus and method may be used in any field of electrical or optical application. Those having ordinary skill in the field of this invention will appreciate the advantages of the invention, and its application to a wide variety of electrical uses.

The above objects and others not specifically recited are realized in a specific illustrative embodiment of an electro-optical voltage sensor device and system whereby one may measure the voltage difference (or electrical potential difference) between objects or positions. Voltage is a function of the electric field hereinafter "electric field" shall be indicated "E-field") and the geometries, compositions and distances of the conductive and insulating matter. Where, as in the present invention, the effects of an E-field can be observed, a voltage measurement can be calculated.

The sensor device may be utilized to sense or measure an E-field using a source beam of electromagnetic radiation. The sensor device comprises a sensor body disposed in the E-field. The sensor has an input for receiving the source beam into the sensor body. The sensor body also has first and second outputs.

A polarization beam displacer is disposed in the sensor body and is optically coupled to the input. The polarization beam displacer separates the source beam into a first beam having substantially a first linear polarization orientation and a second beam having substantially a second linear polarization orientation. The polarization beam displacer also directs the first beam along a first path and the second beam along a different second path. The second beam may be discarded.

A wave plate is disposed in the sensor body and is optically coupled to the polarization beam displacer for rotating the first polarization of the first beam to a rotated polarization with major and minor axes.

A transducer is disposed in the sensor body and is optically coupled to the wave plate. The transducer induces a differential phase shift on the major and minor axes of the rotated polarization in response to the E-field when the transducer is exposed to the E-field.

A reflecting prism is disposed in the sensor body and is optically coupled to the transducer. The prism redirects the first beam back through at least the polarization beam displacer means. The prism may also reflect the first beam back through the transducer and wave plate. The reflecting prism may also convert the rotated polarization of the first beam to circular or elliptical polarization.

The transducer may further induce a differential phase shift on the major and minor axes of the circular or elliptical polarization of the first beam as the first beam passes back therethrough. The wave plate rotates the major and minor axes of the circular or elliptical polarization of the first beam.

As the first beam passes back through the polarization beam displacer, the polarization beam displacer separates the first beam into a third beam representing the major axis of the first beam and a fourth beam representing the minor axis of the first beam. The polarization beam displacer also directs the third beam along a third direction towards the first output and the fourth beam along a different fourth direction towards the second output.

The invention may also comprise a graded index lens disposed in the sensor body between the input and the polarization beam transducer. The lens collimates the beam of electro-magnetic radiation. Other lenses may also be used to collimate and/or collect the third and fourth beams.

The invention may also comprise graded index lenses disposed in the sensor body at the first and second outputs. The lenses collect and focus the third and fourth beams.

The invention may also employ a transmitter, a detector, and a signal processor. The transmitter produces a beam of electro-magnetic radiation which is routed into the sensor device. Although this electromagnetic radiation used in the present invention can comprise any wavelengths beyond the visible spectrum, the term "light", "beam", and/or "signal" may be used hereinafter to denote electro-magnetic radiation for the purpose of brevity.

The first beam undergoes an electro-optic effect when the sensor is placed into the E-field, and is observable as a phase differential shift of the major and minor axes of the elliptical polarization. The planes of propagation are the object of the differential phase shift. The differential phase shift causes a corresponding change in the beam's polarization. The polarization change is in turn converted into a set of amplitude modulated (AM) signals of opposing polarity that are transmitted out of the sensor. The detector converts the set of optical AM signals into electrical signals from which the voltage is determined by the signal processor.

The sensor processes the beam by splitting the beam in accordance with the components of the orthogonal polarization planes into at least two AM signals. These AM signals are then processed in an analog circuit, a digital signal processor, or both. The AM signals may be converted to digital signals, fed into a digital signal processor and mathematically processed into a signal proportional to the voltage which produced the E-field. In addition, the AM signals may be optically processed. Alternatively, the output of the analog circuit are a sinusoidal waveform representing the frequency and peak-to-peak voltage and an RMS voltage. Additional objects and advantages of the invention will be set forth in the description which follows, and in part will be apparent from the description, or maybe learned by the practice of the invention without undue experimentation. The objects and advantages of the invention may be realized and obtained by means of the instruments and combinations particularly pointed out in the appended claims.

BRIEF DESCRIPTION OF THE DRAWINGS

The above and other objects, features and advantages of the invention will become apparent from a consideration of the subsequent detailed description presented in connection with the accompanying drawings in which.

DETAILED DESCRIPTION OF THE INVENTION

Figure 1:
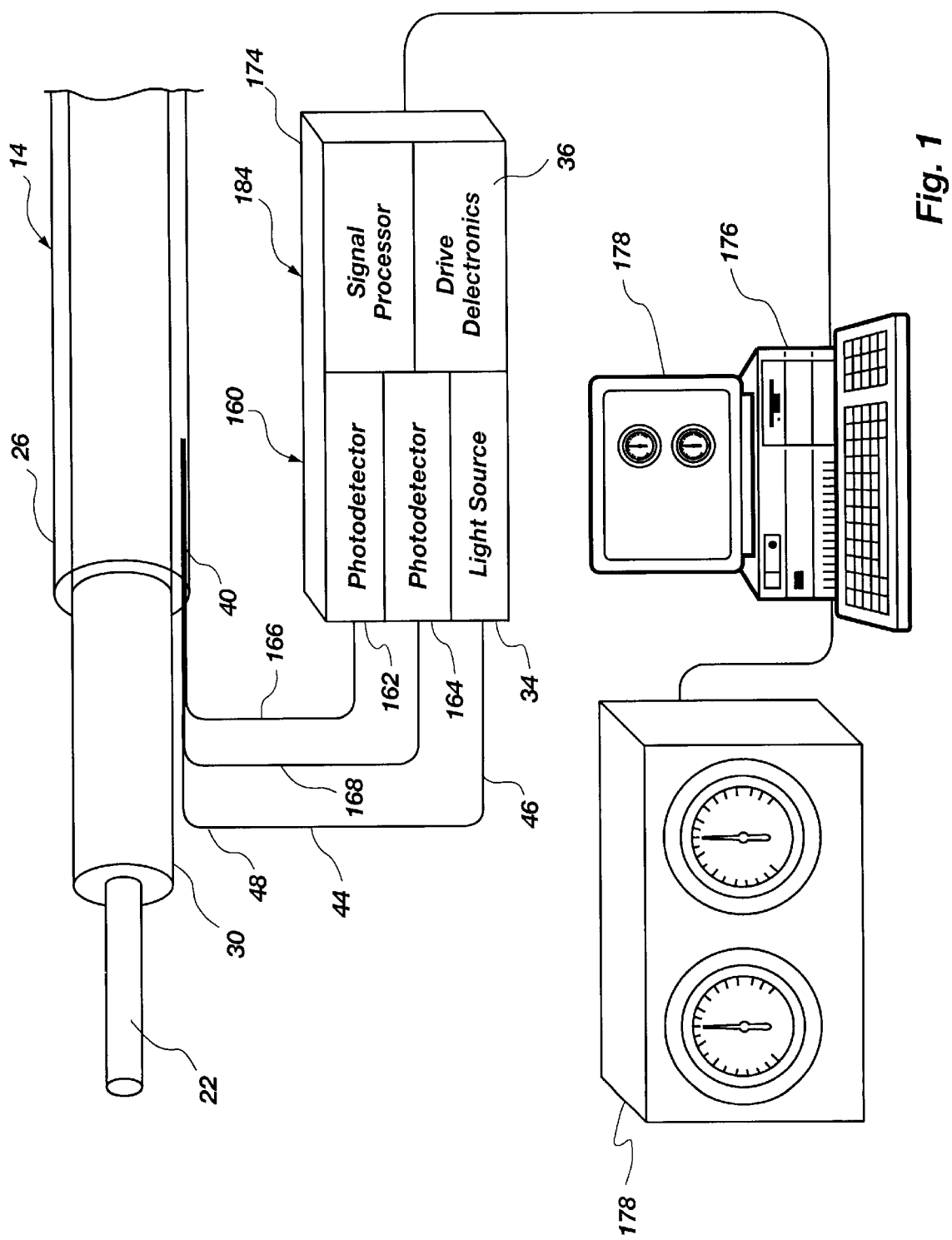
FIG. 1 is a schematic view of a preferred embodiment an electro-optic high-voltage sensor system in accordance with the principles of the present invention.

For the purposes of promoting an understanding of the principles in accordance with the invention, reference will now be made to the embodiments illustrated in the drawings and specific language will be used to describe the same. It will nevertheless be understood that no limitation of the scope of the invention is thereby intended. Any alterations and further modifications of the inventive features illustrated herein, and any additional applications of the principles of the invention as illustrated herein which would normally occur to one skilled in the relevant art and having possession of this disclosure, are to be considered within the scope of the invention claimed.

Figure 3A:
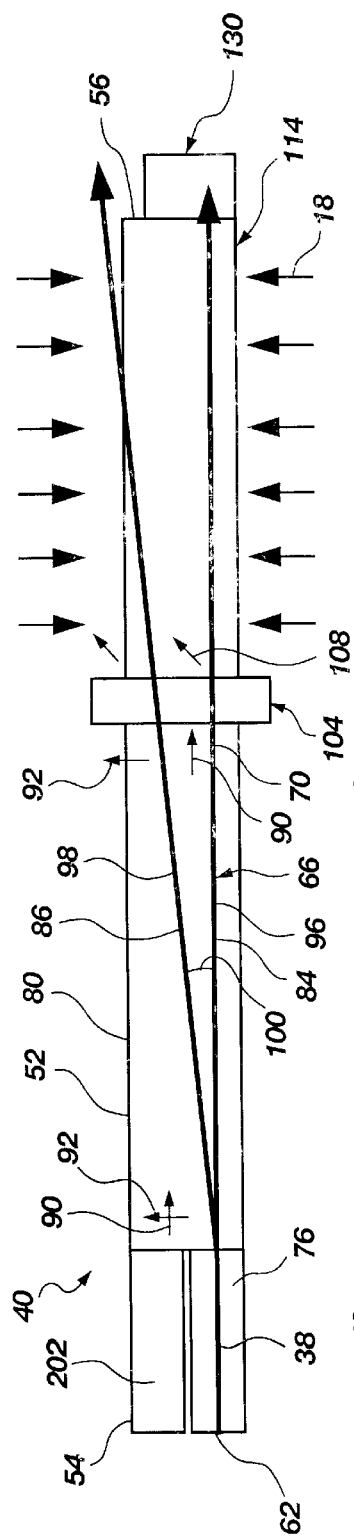
FIG. 3a is a side view of the preferred embodiment of the electro-optic voltage sensor device in accordance with the principles of the present invention showing a source beam of electro-magnetic radiation on an initial pass through the device.

As illustrated in FIG. 1, an electro-optic voltage sensor system, indicated generally at 10, of the present invention is shown. The system 10 may be used to sense and/or measure electrical characteristics, such a voltage difference or electrical potential difference, of an electrical device 14. The electrical device produces an electrical field (indicated by arrows 18 in FIGS. 3a and 3c) or E-field. The voltage is a function of the E-field (FIGS. 3a and 3c), and geometries, compositions, and distances of conductive and insulating matter. Thus, where the effects an E-field can be observed, a voltage measurement can be calculated.

The electrical device 14 has a conductor 22, or an energized conductor, and a grounded conductor 26. The electrical device may have an insulator 30 between the energized conductor 22 and the grounded conductor 26. The E-field (FIGS. 3a and 3c) may be produced in the insulator 30 between the energized conductor 22 and the grounded conductor 26 when voltage is applied to the conductor 22. The electrical device 14 may be a high-voltage electrical cable, as shown. In the case of a high-voltage cable, the energized conductor 22 is a high-voltage wire, the insulator 30 is insulation or an insulated media surrounding the wire, and the grounded conductor 26 is a sheath surrounding the wire and insulation. Thus, the wire, insulation, and sheath are coaxial with a space between the conductor and grounded conductor.

The high-voltage cable is one example of an electrical device or E-field source. The electrical device may be any source of an E-field, including for example, a shielded cable joint, a terminator, a through-hole insulator, a shielded bus, an insulated switchgear, or a duct-enclosed bus.

Figure 2:
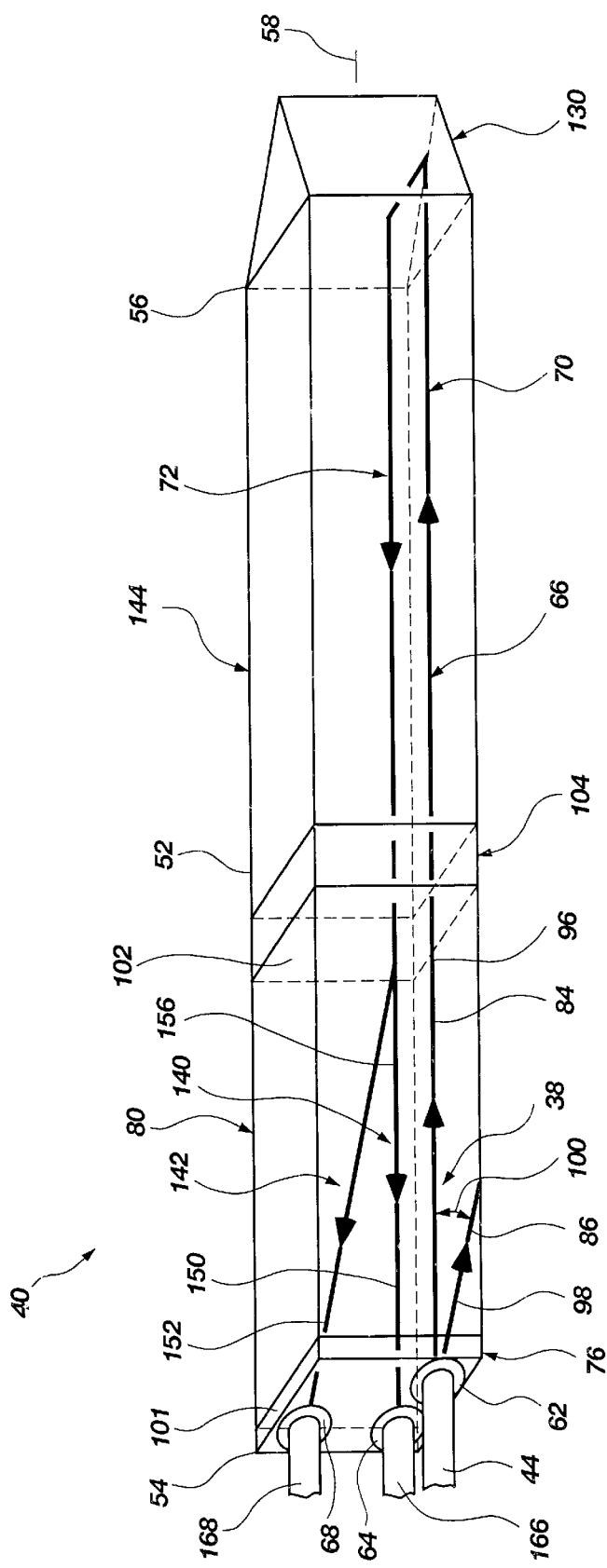
FIG. 2 is a schematic view of a preferred embodiment of an electro-optic voltage sensor device in accordance with the principles of the present invention.
Figure 3B:
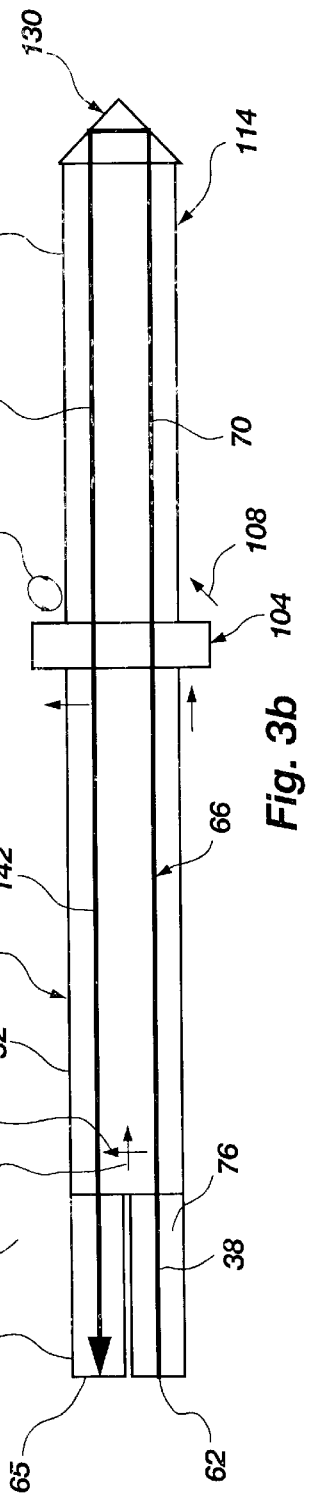
FIG. 3b is a top view of the preferred embodiment of the electro-optic voltage sensor device in accordance with the principles of the present invention showing the source beam on the initial pass and a return pass through the device.
Figure 3C:
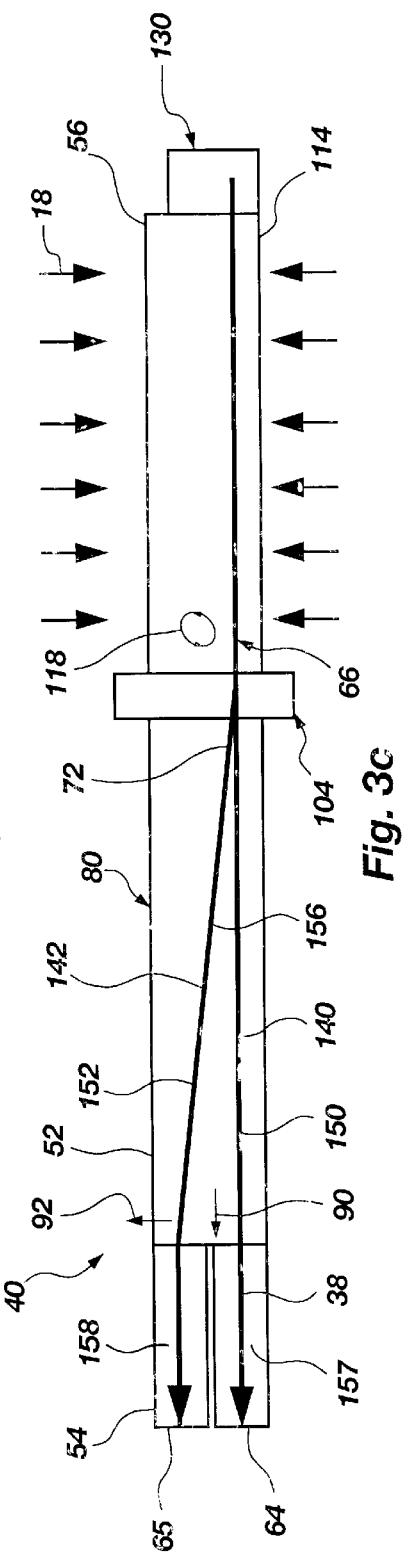
FIG. 3c is a side view of the preferred embodiment of the electro-optic voltage sensor device in accordance with the principles of the present invention showing the source beam on the return pass through the device.

The system 10 includes a transmitter or transmitting source 34 which produces and transmits a source beam 38, as shown in FIGS. 2–3c, of electro-magnetic radiation. The transmitter 34 may produce any wavelength of electro-magnetic radiation, including wavelengths within the visible spectrum or beyond the visible spectrum. The term "light", "beam", and/or "signal" may be used hereinafter to denote all electro-magnetic radiation for the purpose of brevity. The transmitter 34 may be a light source and the source beam 38 may be a light beam produced by the light source. In the preferred embodiment, laser light is used. Thus, the transmitter 34 may be a laser and the source beam 38 may be the laser light. The transmitting source 34 may be driven by drive electronics 36. The drive electronics 36 may be controlled by a computer device 176.

The system 10 includes a sensor head or sensor device 40. The sensor 40 is optically coupled to the transmitter 34 so that the sensor 40 receives the source beam or light beam 38. A first fiber optic or fiber optic cable 44 may be used to optically couple the sensor 40 to the transmitter 34. The first fiber optic 44 has a first end 46 coupled to the transmitter 34 and a second end 48 coupled to the sensor 40. The first fiber optic 44 directs or optically communicates the source beam 38 from the transmitter 34 to the sensor 40. The fiber optic 44 electrically isolates the sensor 40 from the transmitter 34 and the rest of the system to protect personnel and equipment from the dangers of high voltage. The first fiber optic 40 is preferably a single mode fiber.

The sensor 40 is advantageously disposed in the E-field (FIGS. 3a and 3c) without contacting the energized conductor 22. The sensor 40 is preferably disposed between the energized conductor 22 and the grounded conductor 26, or in the insulator 30. The sensor's 40 location and non-contact relationship to the conductor 40 also help protect personnel and equipment form the dangers of high voltage. Prior art sensors, or their transducers, directly connected to the conductor by a capacitive voltage divider. The sensor 40 of the present invention uses a fixed ground plane to partition the E-field and does not require connection to the current carrying conductor 22.

Referring to FIGS. 2 and 3a–c, the sensor 40 has an elongated sensor body 52 with a first end 54 and a second end 56. The sensor body 52 also may have a longitudinal axis 58. The first fiber optic 44 is coupled to the first end 54 of the sensor body 52, or the source beam 38 is received by the sensor body 52 at the first end 54, defining an input 62. The body 52 also has first and second outputs 64 and 65, as discussed more fully below. The source beam 38, or components thereof, passes through the sensor body 52, preferably from the first end 54 to the second end 56 and back again, defining a primary path 66. The source beam 38 preferably passes from the first end 54 to the second end 56, defining an initial pass 70. Thus, on the initial pass 70 the source beam 38 enters the sensor body 52. The source beam 38, or its components, also preferably passes from the second end 56 to the first end 54, defining a return pass 72. Thus, on the return pass 72 the source beam 38, or its components, exit the sensor body 52. It is of course understood that the source beam 38 need not pass is entirely through the sensor body 52 to its physical end.

The sensor 40 has a graded index lens 76, or a collimator, disposed in the sensor body 52 and optically coupled to the first fiber optic 44, and thus the transmitter 34, so that the source beam 38 passes therethrough upon entering the sensor body 52. The graded index lens 76 is preferably disposed at the first end 54 of the sensor body 52 and is preferably the first optical element encountered by the source beam 38 upon entering the sensor body 52. The graded index lens 76 collimates the source beam 38 as the source beam 38 passes through the lens 76 on the initial pass 70. The graded index lens 76 is one example of a collimator means for collimating the source beam 38. Any means for collimating the source beam 38 may be used.

The sensor 40 advantageously has a polarization beam displacer 80 disposed in the sensor body 52 and optically coupled to the graded index lens 76, or collimater. The polarization beam displacer 80 is preferably disposed adjacent the graded index lens 76 and is preferably the second optical element encountered by the source beam 38 in the sensor body 52. It is of course understood that the polarization beam displacer 80 need not be physically adjacent the graded index lens 76 and may be separated therefrom by a space or some translucent medium.

The polarization beam displacer 80 separates the source beam 38 into components, or first and second beams 84 and 86, as the source beam 38 passes therethrough on the initial pass 70. The polarization beam displacer 80 can be a piece of crystaline birefringent material, such as calcite or equivalent, with a fast and slow axis that provides for polarization separation of an impinging light source, as known by those of skill in the art. The source beam 38 has first and second orthogonal linear polarization orientations (or horizontal and vertical polarization orientations), indicated by arrows 90 and 92 respectively. The source beam 38 may or may not be polarized upon arrival at the polarization beam displacer 80, but the source beam 38 is polarized, or re-polarized, by the polarization beam displacer 80. The polarization beam displacer 80 separates the source beam into two beams 84 and 86 of different, orthogonal linear polarization orientations. Thus, the first beam 84 has substantially the first linear polarization 90 (or vertical polarization) while the second beam 86 has substantially the second linear polarization 92 (or horizontal polarization).

In addition, the polarization beam displacer 80 directs the first and second beams 84 and 86 along two different directions, or different first and second paths 96 and 98. The first beam 84 traveling along the first path 96 defines the primary path 66. The primary path 66 and first path 96 may be co-linear. The second beam 86 traveling along the second path 98 defines a secondary path. The second beam 86 may be discarded by being directed out of, or towards the sides, top or bottom of, the sensor body 52.

The first and second beams 84 and 86, or first and second paths 96 and 98, define a separation angle 100 therebetween. The polarization beam displacer 80 directs the beams 84 and 86 in two directions 96 and 98 with a relative angle, or separation angle 100. The separation angle 100 is preferably large enough that the second beam 86 passes out of, or into, the top or bottom of the sensor body 52 without the second beam 86 reaching the second end 56 of the sensor body 52, and is thus discarded. The separation angle 100 and length of the sensor body 52 are related. A larger separation angle 100 results in a shorter sensor body 52. A smaller separation angle 100 results in a longer sensor body 52. Because the sensor 40 may be disposed in an insulator 30, between a conductor and grounded conductor 26, as shown in FIG. 1, which may be a narrow space, the sensor body 52 is preferably narrow.

The polarization beam displacer 80 has opposite first and second surfaces 101 and 102, or first and second ends. The polarization beam displacer 80 receives the source beam 38 at, or through, the first surface 101 and passes the first beam 84 through the second surface 102. The polarization beam displacer 80 receives the first beam 84 back at, or through, the second surface 102.

The polarization beam displacer 80 is one example of a means for separating the source beam 38 into a first beam 84 of the first polarization 90 and a second beam 86 of the second polarization 92, and for directing the first and second beams 84 and 86 along different paths or in different directions. Any such means for separating and directing the beams may be used which preferably separates the beams by less than 90 degrees.

The sensor 40 includes a half wave plate 104 disposed in the sensor body 52 and optically coupled to the polarization beam displacer 80. The wave plate 104 is preferably disposed adjacent the polarization beam displacer 80 and is preferably the third optical element encountered by the source beam 38, or its component the first beam 84. Again, it is understood that the wave plate 104 need not contact the polarization beam displacer 80, but may be separated therefrom by a space or translucent medium. The wave plate 104 rotates the first polarization 90 of the first beam 84, indicated at 108, as the first beam 84 passes through the wave plate 104 on the initial pass 70. The wave plate 104 is preferably a half wave plate oriented to rotate the polarization 45 degrees with respect to the electric field on the transducer, as discussed below. The wave plate 104 is one example of a polarization altering means for rotating the linear polarized beams, and circular or elliptical polarized beams. Any such means for converting or rotating the polarization of the beams may be used, including for example, any wave retardation optic or combination of optics.

The sensor 40 also includes a cell or transducer 114 disposed in the sensor body 52 and optically coupled to the wave plate 104. The cell 114 is preferably disposed adjacent the wave plate 104 and is preferably the fourth optical element encountered by the source beam 38, or its component the first beam 84. It is understood that the cell 114 need not be in contact with the polarization beam displacer which is responsive to the E-field 18. The cell 114 or material alters the polarization 108 of the first beam 84, or major and minor axes of the rotated polarization 108, in response to the E-field 18, and in proportion to the magnitude of the E-field 18, as the first beam 84 passes therethrough on the initial pass 70. Thus, the cell 104 may be a Pockels crystal or Pockels transducer. The cell 114 or material is preferably MgO-doped $LiNbO_3$. In addition, the MgO-doped $LiNbO_3$ material is preferably z-cut.

The sensor 40 includes a reflecting prism 130 disposed in the sensor body 52 and optically coupled to the cell or transducer 114. The reflecting prism 130 is preferably disposed at the second end 56 of the sensor body 52 and is preferably the fifth optical element encountered by the source beam 38 or its component the first beam 84. Again, it is understood that the prism 130 need not contact the cell 144. It is also understood that the prism 130 need not be disposed at the physical end of the sensor body 52, but preferably defines the end of the sensor body with respect to the source beam 38 or its components. The reflecting prism 130 reflects the first beam 84 back to the first end 54 of the sensor body 52 defining the return path 72. In addition, the reflecting prism 130 preferably reflects the source beam 38, or its component the first beam 84, back through the cell 114, the wave plate 104, the polarization beam displacer 80, and the graded index lens 76.

The reflecting prism 130 is one example of reflecting means for reflecting the first beam 84 back through the body 52. The first beam 84 on the return pass 72 travels substantially parallel to the first beam 84 on the initial pass 70. By reflecting or redirecting the beam 84 back towards the first end 54 of the sensor body 52, the beam may exit the same end it entered. Any means for returning the beam of electromagnetic radiation back through the body may be used, including for example, a mirror, a light guide, a fiber optic, etc.

The reflecting prism 130 also preferably converts the rotated polarization 108 of the first beam 84 to circular or elliptical polarization, indicated at 118. In the absence of an electric field across the transducer 114, the transducer will not induce a phase shift on the major and minor axes and the reflecting prism 130 will convert the rotated polarization 108 to circular polarization. If an electric field is present across the transducer 114, the transducer will induce a phase shift on the major and minor axes and the reflecting prism 130 will convert the rotated polarization 108 to elliptical polarization.

As the first beam 84 again passes through the cell or transducer 114 on the return pass 72, the cell 114 induces a differential phase shift on the major and minor axes of the circular or elliptical polarization 118 of the first beam 84. The return pass 72 is in the opposite direction of the y-axis and helps to compensate for temperature induced bi-refringence.

When the cell or transducer 114 (also called the transducing medium) is in a non-zero E-field (not shown) it induces a "differential phase shift" to orthogonal beam components of a beam through the Pockels electro-optic effect, which will now be explained. In the polarized beam the light has at least two components which propagate along at least two orthogonal planes, respectively, thus forming at least two orthogonal planes within the beam. The phase of the components in each plane of propagation are the object of a shift, relative to the phase of the component in the other plane, in the transducer. The Pockels electro-optic effect, which takes place in the transducer, changes the relative phases of the beam components by altering their respective velocities, and is observed in Pockels transducing crystals and similar media. The magnitude of the phase shift, called the "differential phase shift", is proportional to the magnitude of the E-field. Thus, the Pockels electro-optic effect is observed as a "phase differential shift" of the orthogonal beam components which is proportional to the magnitude of the E-field. Due to the fixed coaxial structure of the devices in which the sensor head is to be installed, the magnitude of the E-field is proportional to the voltage. Therefore, the differential phase shift is proportional to (and can be used to measure) the voltage of the E-field between energized conductor and ground conductor.

The phase shift between orthogonal components further manifests itself as an alteration of the beam's polarization. Therefore, the beam may be considered either to be a differential phase shifted signal or an optical polarization modulation signal. The polarization modulation signal is used in the present invention because it can be detected using low-cost, components that are less susceptible to temperature, mechanical perturbations, and optical incoherence than those components that would be required to sense the differential phase shift directly.

In the practice of the present invention, the sensor 40, the sensor body 52, or the transducer 114 may be encased in a dielectric buffering material, not shown, to smooth the transition geometry between the permittivity of the transducer 114 and the permittivity of the surrounding media, which in most cases will be an insulator. The dielectric buffering material promotes uniformity in the E-field, particularly around the edges of the transducer 114. This enhances uniform phase shift in the beam passing through the transducer 114, and minimizes voltage stress on the materials in and surrounding the sensor 40 as well, thereby increasing the probable maximum operating lifetime of the entire system.

As the first beam 84 again passes through the wave plate 104 on the return pass 72, the wave plate 104 rotates the major and minor axes of the circular or elliptical polarization 118 of the first beam 84 as the first beam 84 passes therethrough, representing the major and minor axes of the ellipse. The wave plate 104 rotates the major and minor axes of the beam 45 degrees to align ellipse axes to the beam separator 80, or so that the major and minor axes are coplanar with the beam displacer 80.

The polarization beam displacer 80 separates the first beam 84 into a third beam 140 and a fourth beam 142. The third beam 140 has the first linear polarization 90 while the fourth beam 142 has the second linear polarization 92. The third beam represents the major axis of the elliptical polarization 118 while the fourth beam represents the minor axis of the elliptical polarization 118. Thus, the beam displacer 80 converts the ellipse into two amplitude signals.

In addition, the polarization beam displacer 80 directs the third and fourth beams 140 and 42 along two different directions, or different third and fourth paths 150 and 152. The polarization beam displacer 80 directs the third beam 140 towards the first output 64, and the fourth beam 142 towards the second output 65.

The third and fourth beams 140 and 142, or third and fourth paths 150 and 152, define a separation angle 156 therebetween. The polarization beam displacer 80 directs the beams 140 and 142 in two directions with a relative angle, or separation angle 156. The separation angle 156 is preferably large enough that the third and fourth beams 140 and 142 become separated in a relatively short distance with respect to the sensor body 52. In addition, the separation angle 156 is preferably small enough that the sensor body 52 remains relatively narrow or slender. A larger separation angle 156 results in a shorter sensor body 52, while a smaller separation angle 156 results in a longer sensor body 52.he sensor body 52 are related. Because the sensor 40 may be disposed in an insulator 30, between a conductor 22 and grounded conductor 26, as shown in FIG. 1, which may be a narrow space, the sensor body 52 is preferably narrow, or the separation angle 156 is preferably small.

The separation angle 156 advantageously is preferably at least less than an angle separating two beams from a beam splitter, or less than 90 degrees. In addition, the polarization beam displacer 80 advantageously passes the third and fourth beams 140 and 142 through the first surface 101. Therefore, the input 62 and first and second outputs 64 and 65 are advantageously located at the same end of the sensor 40, the first end 54 of the sensor body 52, to facilitate insertion of the sensor 40 in the E-field between the conductor 22 and grounded conductor 26. In addition, the source beam 38 preferably enters the sensor body 52 and the third and fourth beams 140 and 142 preferably exit the sensor body 52 in a straight linear manner, without right angles, to minimize the size of the sensor 40. It should be noted that a graded index lens allows off-axis beam collection in the deflected signal, as discussed more fully below.

Prior art beam splitters, on the other hand, typically separate beams so that one remains relatively straight while the other is directed at a right angle, or perpendicular, to the first. In addition, such beam splitters typically pass one of the beams out of side or plane perpendicular to a side or plane in which the beam enters. Such beam splitters require an additional mirror or prism to redirect the perpendicular beam to be more parallel with the first. The perpendicular beam and addition prism increase the width of the prior art sensor. Although the beam splitter of the prior art may be removed from the prior art sensor head itself and located elsewhere in the optical path, for example prior to the detector, such a solution requires additional components.

In the polarizing beam displacer 80, the first beam 84 is separated in accordance with the respective axes of its polarization ellipse 118 into amplitude modulated (AM) signals, or third and fourth beams 140 and 142 with first and second linear polarizations 90 and 92, respectively. The said polarization ellipse 118 will exhibit an ellipticity ranging between −1 and +1, in proportion to voltage at any given time. Those skilled in the art will note that an elliptic polarization whose ellipticity ranges between −1 and +1 can be described as ranging from a linear polarization along one axis, for example 90, to a linear polarization along a second axis, for example 92, perpendicular to the first axis, wherein the point at which ellipticity equals 0 corresponds to circular polarization. The major and minor axes of the polarization ellipse 118 of the first beam 84 can be represented by two orthogonal components, or third and fourth beams 140 and 142 with first and second polarizations 90 and 92, respectively. The polarization beam displacer 80 then separates the first beam 84 into two components, or third and fourth beams 140 and 142 with first and second polarizations 90 and 92, respectively, which comprise the intensities along each of the two axes of the polarization ellipse 118 shown as orthogonal components 90 and 92. The intensity of beam components, or the third and fourth beams 140 and 142, will modulate conversely to one another in response to modulations in the ellipticity of the beam's polarization. The beam components are two amplitude modulated (AM) signals, shown as 140 and 142, respectively.

The third and fourth beams 140 and 142 may be passed through second and third graded index lenses 157 and 158 which collect the third and fourth beams 140 and 143 and couple them to the outputs or fiber optic by focusing the beams into the fiber optic. The third and fourth beams 140 and 142 may be passed through separate beam collection optics, different from the collimator 76 which collimates the source beam 38, as discussed more fully below.

Referring to FIG. 1, the sensor system includes a detector 160 for receiving the two AM signals, or third and fourth beams 140 and 142. The detector 160 may include first and second photo-detectors 162 and 164 for receiving the AM signals 140 and 142, respectively. The third and fourth beams 140 and 142 maybe optically communicated, or the sensor 40 optically coupled, to the first and second photo-detectors 162 and 164 by second and third fiber optics 166 and 168, respectively. The fiber optics 166 and 168 are coupled at one end to the sensor body 52, at the first and second outputs 64 and 65, respectively, and at another end to the first and second photo-detectors 162 and 164. In the preferred embodiment the second and third fiber optics 166 and 168 comprise at least one optic fiber, wherein the optic fiber is a multi-mode optic fiber.

In the photo-detectors 162 and 164, the AM signals 140 and 142 become electrical signals. The electrical signals are routed into a signal processor 174, which may be part of the detector 160, wherein a desired E-field characteristic is determined, particularly that of voltage. In addition, the signals may be routed to a computer device 176. The AM signals may be processed by an analog circuit, a digital signal processor, or a combination of both.

To determine the voltage in the practice of the preferred embodiment of the present invention the signal processor 174, or computer 176, is designed to process each AM signal, in an analog circuit, digital signal processor, or both. The digital signal processor receives the AM signals when converted into digital signals and mathematically processes them into a signal proportional to the voltage which produced the E-field. In addition, the AM signals may also be optically processed, as discussed further below. Furthermore, the outputs of the analog circuit are a sinusoidal waveform representing the frequency and peak-to-peak voltage and RMS voltage, as discussed further below. The signal processor or computer produces a display signal (not shown) which is then displayed on a readable display 178 such as: digital, hardcopy, video, software, computer memory displays or an audible indicator.

While it is possible to actually measure the relative phases of the orthogonal components 90 and 92 of the beams 140 and 142 after exiting the transducer 144, the relative phase shift can also be derived from the intensities of the AM signals 140 and 142 without using complex and costly approaches as involved in direct phase measurements. Therefore, in the present invention, when the two AM signals 140 and 142 are separated from a single differential phase shifted signal 84 using the polarizing beam displacer 80, the beam's polarization state is analyzed to obtain AM intensity signals. The AM signals 140 and 142 extracted from the beam's polarization state by the polarizing beam displacer 80 are transmitted to and used in the signal processor 174 where their complementary nature facilitates rejection of common mode noise and minimizes effects of temperature dependent intrinsic birefringence that may reside in the transducing medium or other optical components within the system. This feature of the present invention substantially enhances accuracy and practicality of the system and represents an additional advancement over much of the prior art. The signal processor 174 performs these functions while converting the received AM signals 140 and 142 into a single, highly accurate voltage measurement. In addition to measuring the voltage of a device, the invention may be used in conjunction with a device for measuring current to provide information regarding power, power factor angle, and energy on the conductor of interest.

As mentioned, each AM signal 140 and 142 is converted by a photo-detector 162 and 164 into a electrical signal which can be processed by the signal processor 174. The photo-detector comprises an optic-to-electronic conversion means for converting the AM signals into analog electronic signals. Preferably, the analog electronic signals comprise low-level analog voltage signals or current signals.

In the preferred embodiment of the present invention the electrical signals are electronic signals transmitted to the signal processor 174 which correspond to the intensity of the AM signals 140 and 142. Thus, in the practice of the present invention, a series of AM signals are manipulated by the signal processor 174, as each of the electrical signals corresponds to intensity of each AM signal 140 and 142. The electrical signals may be sampled by the signal processor 174 at regular intervals and substantially simultaneously with one another. The sampled signals are the instantaneous intensity for each AM signal 140 and 142. The signals will be discussed below as (A) and (B), respectively.

In the signal processor 174 the instantaneous intensity signal for each beam component 140 and 142 is sampled sequentially and stored, thereby forming a data base of stored signals which represents each AM signal over time. The stored signals are then converted into a displayable signal regarding the voltage of E-field at the transducer 114.

Figure 6:
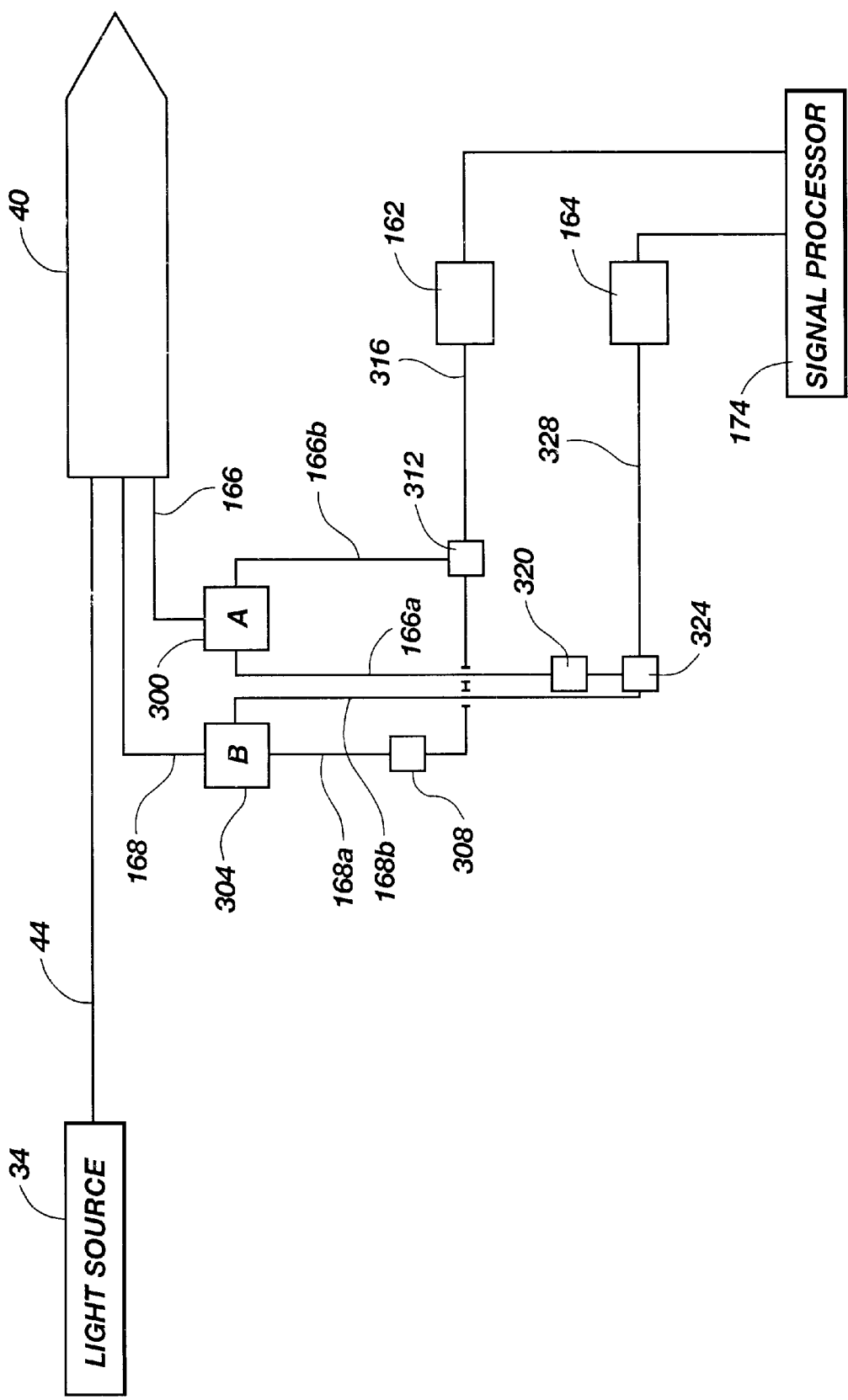
FIG. 6 is a diagram of the electro-optical voltage sensor system configured to enable optical differentiation and summing of the amplitudes of the components of the beam modified by the E-field.

In the preferred embodiment signals are manipulated in the following manner. Referring to FIG. 6, in accordance with the principles of the present invention, it has been discovered that the optical signals produced can be summed and differentiated in a rapid and inexpensive manner by avoiding high speed digital processing, and relying on summing and differentiating of the actual optical signal. In that the polarized light 84 contains two components 90 and 92 (FIG. 3c), hereinafter referred to component A and component B for convenience, it has been found that selectively combining and differentiating of component A and component B can result in inexpensive, rapid and highly accurate voltage determination.

Component A and component B are separated by the beam displacer 80 (FIG. 3c). Component A of the phase shifted light is the sent through optical fiber 166 and component B of the phase shifted light is sent through optical fiber 168. A 50:50 beam splitter 300 is disposed along optical fiber 166 to divide component A into two beams, each having equal intensity. The two beams of component A are carried by optical coupling means 166*a* and 166*b* respectively. The optical coupling means 166*a* and 166*b* maybe mirrors, multiple-mode optical fibers, light pipes, relay optics or any other means for transmitting the light in the manner discussed herein.

Likewise, component B of the phase shifted light is divided into two beams of equal intensity by being passed through a 50:50 beam splitter 304. The two beams of component B are then sent through optical coupling means 168*a* and 168*b*, which will typically be in the same form as optical coupling means 166*a* and 168*a*. For the sake of discussion, component A is that portion of the phase shifted beam 84 which is propagated parallel to the E-field, and component B is that portion of the beam which is propagated perpendicular to the E-field.

In order to differentiate components A and B, a ¼λ plate 308 is placed along optic fiber 168*a*. Component B carried by optic fiber 168*a* is then combined with component A carried by optic fiber 166*b*. Because of the ¼λ plate 308, component A and component B are 180 degrees out of phase. Since the beams are 180 degrees out of phase, the two beams will subtract from each other when they are combined, as represented by box 312. This, in turn, produces a difference signal (A−B), carried by an optical means, such as a multi-mode optic fiber 316.

In order to sum the components A and B, a ¼λ plate 320 is placed along optic coupling means 166*a* to change the phase of component A. Because of the ¼λ plate 320, component beam A and component beam B are in phase when the two beams are combined, as represented by box 324. Since the two beams are in phase, the two beams will add to one another when combined, thereby producing a sum signal (A+B), carried by optical means, such as a multi-mode fiber 328.

Once the difference signal and the sum signal are determined, the elliptical-polarization of the beam can be readily determined as the difference divided by the sum.

$$\frac{A-B}{A+B} = \sin\theta$$

wherein θ is the phase difference between component A and component B. Of course, the phase difference is proportional to the E-field, which is proportional to the voltage.

One significant advantage of the configuration shown in FIG. 6 is that it decreases the effect of misalignments. By determining intensity in the manner described, first order misalignments cancel out. Thus, a less precision is required in manufacturing the sensor while still facilitating the ability to obtain a highly accurate determination of voltage. This, in turn, reduces manufacturing costs and results in fewer errors.

The above method provides an optical solution to creating sum and difference signals for post phase rotation analysis. The signals are created at optical speeds without the need for fast electronics to produce the information. Additionally, this optical solution also simplifies problems created by unmatched photodiode response characteristics. Calibration between the two photodiodes now requires only simple gain changes. Likewise, errors induced by changes in the transmission characteristics of the optical fibers are reduced.

As indicated above, the AM signals also may be processed by an analog circuit. The analog circuit would essentially accomplish the same function as the optical system described in FIG. 6. The analog circuit may sum the signals and difference the signals. The analog circuit may then determine the inverse sin of the ratio of the difference and sum signals. Using a scaling factor the peak-to-peak voltage may be determined. In addition, the RMS voltage may be extracted.

The detector 160 and signal processor 174 may be combined into a single unit. Likewise, the transmission source 34 and drive electronics 36 may be combined into a single unit. As shown in FIG. 1, all the components, such as the detector 160, the signal processor 174, the transmission source 34, and the drive electronics 36 may be a single unit 184.

Figure 5:
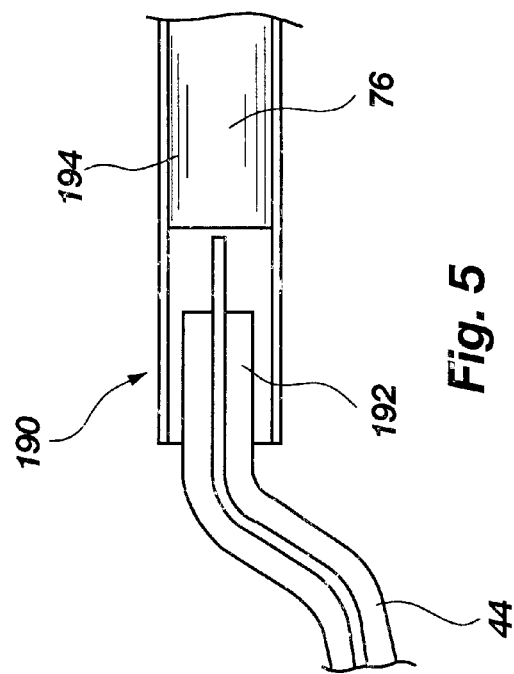
FIG. 5 is a side view of a preferred embodiment of a coupling between a fiber optic and the sensor device in accordance with the principles of the present invention.

Referring to FIG. 5, the first optical fiber 44, may be coupled to the graded index lens 76 by a collimator device 190. The collimator device 190 has a standard fiber ferrule 192 contacting the graded index lens 76. The fiber optic 44 is mounted in the fiber ferrule 192. The fiber ferrule 192 and graded index lens 76 are disposed in a connecting sleeve 194. Therefore, the source beam 38 exiting the collimator device 190 is collimated.

Figure 4:
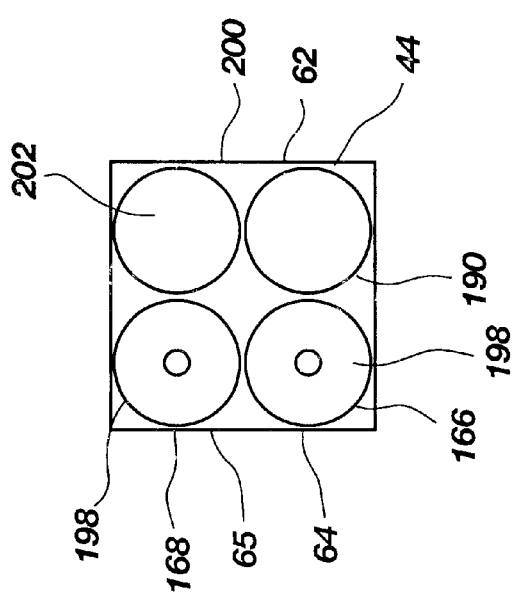
FIG. 4 is an end view of the preferred embodiment of the electro-optic voltage sensor device in accordance with the principles of the present invention.

First and second collector devices 198 with similar structure may also be used for the outputs 64 and 65, as shown in FIG. 4, where the second and third graded index lenses 157 and 158 collect the third and fourth beams. Thus, the source beam 38 may be collimated by a first collector device 198 with a first graded index lens 76, while the third and fourth beams 140 and 142 are collected by first and second collector devices each with a separate graded index lens. As the third and fourth beams 140 and 142 enter similar collector devices 198 the graded index lenses 157 and 158 act as a beam collectors due to their ability to accept off-axis beams and concentrate the beams into the fiber core. This ability simplifies alignment during assembly and allows improved collection from the displaced output beams 140 and 142. The collimator device 190 and collector devices 198 may be disposed in the sensor body 52 or form part of the sensor body 52.

Referring to FIG. 4, the collimator device 190 and collector devices 198 are housed in a cell or housing 200. The cell 200 receives the collimator device 190 and collector devices 198 as well as at least a portion of the polarization beam displacer 80 to align the input 62 and outputs 64 and 65 with the displacer 80. A dummy collimator 202 may be used as a placeholder to allow for easy alignment. The dummy collimator 202 may also extend beyond the housing 200 to act as a strain relief for the other fibers 44, 166 and 168. The collimator device 190 is an example of collimator means for collimating the source beam 38, and the collector device 198 is an example of collector means for collecting the third and fourth beams 140 and 142.

In an alternative, the signals may be manipulated in the following manner. First, an average intensity for each independent amplitude modulated signal is calculated. This is done by summing the instantaneous intensities of the signals which have been sampled over a pre-determined time interval and dividing by the number of samples taken in the interval. In the preferred invention this is accomplished by taking the average of the signals over time for each beam component by summing the signals of each beam component and dividing the sum by the number of signal samples taken.

Mathematically, the average intensity for the AM signal (A) is expressed as follows:

$$\overline{A} = (1/L) \sum_{i=n-L}^{n} A_i$$

where the average intensity is $(\overline{A})$, the instantaneous AM signal is $(A_i)$, the number of samples is (L), the samples are taken and stored at uniform time intervals (i), and the average is calculated using samples between present time index n and past time index (n-L). Similarly, the average intensity for the AM signal (B) is expressed as follows:

$$\overline{B} = (1/L) \sum_{i=n-L}^{n} B_i$$

where the average intensity is $(\overline{B})$, the instantaneous AM signal is $(B_i)$, with the other values being as above.

Next, an adjusted instantaneous intensity for each signal is found by comparing the most recent instantaneous signal intensity with the average signal intensity of the corresponding AM signal. Thus, for the beam component corresponding to AM signal (A), the adjusted instantaneous intensity $(\alpha_n)$ is:

$$\alpha_n = \overline{A} - A_n$$

Where at $(A_n)$ is the instantaneous intensity of AM signal (A) at the present time index. Similarly, for AM signal (B), the adjusted instantaneous intensity $(\beta_n)$ is:

$$\beta_n = \overline{B} - B_n$$

Where $(B_n)$ is the instantaneous intensity of signal (B) at the present time. It will be recognized by those skilled in the art that because signals (A) and (B) each represents a different axis on the polarization ellipse, their amplitudes will change in opposite directions from one another for a given change in polarization. Thus where the intensity of one signal increases there will be a decrease of intensity of equal magnitude in the other signal. Therefore, the adjusted instantaneous intensity signals $(\alpha_n)$ and $(\beta_n)$ must be computed as indicated above in order to preserve sign.

The adjusted average instantaneous intensity signal for both signals (A) and (B) compensates for any temperature induced birefringence that may exist within the transducer. Temperature induced birefringence causes a change in the intensity of the AM signals over time, as the transducer heat or cools. The variation in the intensity due to temperature-dependant intrinsic birefringence of the transducer appears as a modulation or variation in the average intensity. Thus, by comparing the instantaneous intensity with the average intensity of the signals, and deducting the average intensity from the instantaneous intensity, temperature induced variations of the signal due to the birefringence in the transducer are compensated for in the adjusted instantaneous intensity signals $(\alpha_n)$ and $(\beta_n)$.

An additional manipulation of the adjusted instantaneous intensity signals $(\alpha_n)$ and $(\beta_n)$ compensates for intensity fluctuations and other common mode noise. This is accomplished by comparing the average of the adjusted instantaneous intensity signals $(\alpha_i)$ and $(\beta_i)$ for the signals (A) and (B). This comparison entails calculating the average between $(\alpha_n)$ and the sign-reversed value of $(\beta_n)$.

$$\gamma_n = \frac{(\alpha_n - \beta_n)}{2}$$

This average $(\gamma_n)$ is directly proportional to the voltage. This is so because the Pockels electro-optic effect induces a differential phase shift in the orthogonal planes 90 and 92 of the beams 140 and 142 which is directly proportional to the E-field 18, and the E-field is directly proportional to voltage. Thus, for a sampling of interest (n), the average instantaneous intensity signal $(\gamma_n)$ for the signals (A) and (B) is directly proportional to the actual instantaneous voltage $(V_n)$ between energized conductor and ground, varying only by a scaling constant (K).

$$V_n = K\gamma_n = K\frac{(\alpha_n - \beta_n)}{2}$$

The scaling constant (K) is determined by applying a precisely known voltage to the device of interest and adjusting the scaling constant (K) until the value measured as the actual instantaneous voltage $(V_n)$ is equivalent to the precisely known voltage being applied. In a typical general application of the present invention, shown in FIG. 1, the sensor head 40 is placed in an insulator 30 between a conductor and a grounded conductor 26. When voltage is applied to the conductor an E-field (FIGS. 3a and 3c) is created between the conductor 22 and the grounded conductor 26, in the insulator 30. Determination of the scaling constant (K) is accomplished by applying a precisely known voltage to the conductor 22. Once the scaling constant (K) is known the electro-optical voltage sensor system may be operated to determine additional actual instantaneous voltages applied to conductor 22.

Although the optical elements described above, such as the polarization beam displacer 80, the wave plate 104, and the cell or transducer 144, each have been described as single units, or as single optical elements, with the source beam 38, and its component the first beam 84, passing through each optical element twice, a first time on the initial pass 70 and a second time on the return pass 72, it is of course understood that the optical elements may comprise multiple units, such as first and second optical elements, with the source beam 38, or its components such as the first beam 84, passing through a first optical unit on the initial pass 70 and a second optical unit on the return pass 72. For example, the polarization beam displacer 80 may comprise a first displacer and a second displacer, with the source beam 38 passing through the first displacer on the initial pass and with the first beam 84 passing through the second displacer on the return pass 72. Similarly, the wave plate 104 and transducer 144 may also be comprised of first and second units.

In addition, although the first beam 84 has been described as returning through all the optical elements (the displacer 80, the wave plate 104, and transducer 144) on the return pass 72, it is of course understood that the optical elements may be configured so that the first beam 84 passes through less than all of the optical elements on the return pass 82 or the initial pass. For example, the first beam 84 may not pass through the transducer 144 on the return pass 72. Similarly, the optical elements may be configured such the source beam 38 passes through less than all of the optical elements. For example, the source beam 38 may not pass through the transducer on the initial pass 72. As another example, the source beam 38 may not pass through the polarization beam displacer 80 if the source beam 38 has already been separated into first and secohogonal polarization orientations.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made without departing from the principles and concepts set forth herein.

We claim:

1. A electro-optic voltage sensor for sensing an E-field produced by an energized conductor comprising:
    a sensor body configured for disposition in the E-field and having an input configured for receiving a source beam of electro-magnetic radiation within the sensor body, the sensor body also having first and second outputs;
    polarization beam displacer means disposed in the sensor body and configured for separating the source beam into a first beam having substantially a first linear polarization orientation and a second beam having substantially a second linear polarization orientation, and for directing the first beam along a first path and the second beam along a different, second path;
    polarization altering means disposed in the sensor body and configured for rotating the first polarization of the first beam to a rotated polarization having major and minor axes;
    sensing means disposed in the sensor body and configured for inducing a differential phase shift on the major and minor axes of the rotated polarization of the first beam in response to the E-field; and
    redirecting means disposed in the sensor body and configured for redirecting the first beam back through at least the polarization altering means and polarization beam displacer means; and
    wherein the polarization altering means is configured for rotating the major and minor axes of the first beam; and
    the polarization beam displacer means is configured for separating the first beam into a third beam representing the major axis of the polarized first beam and a fourth beam representing the minor axis of the polarized first beam, the polarization beam displacer means being configured for directing the third beam along a third direction directly to the first output and the fourth beam along a different, fourth direction directly to the second output.

2. The sensor of claim 1, wherein the redirecting means converts the rotated polarization of the first beam to circular or elliptical polarization and further directs the first beam back through the polarization altering means; and wherein the polarization altering means is configured for rotating the major and minor axes of the circular or elliptical polarization of the first beam before the first beam enters the polarization beam displacer means.

3. The sensor of claim 1, further comprising:
    collimator means disposed in the sensor body configured for collimating the source beam before the source beam enters the polarization beam displacer means.

4. The sensor of claim 1, further comprising:
    collector means disposed in the sensor body for collecting the third and fourth beams.

5. The sensor of claim 1, further comprising:
    a collimator device disposed in the sensor body at the input for collimating the source beam, the collimator device having a sleeve, a fiber ferrule disposed in the sleeve, and a graded index lens disposed in the sleeve in contact with the fiber ferrule.

6. The sensor of claim 1, further comprising:
    a collector device disposed in the sensor body at either the first or second output for collecting either the third or fourth beams, the collector device having a sleeve, a fiber ferrule disposed in the sleeve, and a graded index lens disposed in the sleeve in contact with the fiber ferrule.

7. A sensor of claim 1, wherein the polarization beam displacer means further is configured for separating the third beam and the fourth beam with a separation angle therebetween which is less than 90 degrees.

8. The sensor of claim 1, wherein the polarization beam displacer means has opposite first and second surfaces, and wherein the polarization beam displacer means is configured for receiving the source beam at the first surface and passing the first beam through the second surface, and for receiving the first beam back at the second surface and passing the third and fourth beams at the first surface.

9. The sensor of claim 1, wherein the sensor body configured for disposition in the E-field produced between a conductor and a grounded conductor without contacting the conductor.

10. An electro-optic voltage sensor for sensing an E-field produced by an energized conductor comprising:
    a sensor body configured for being disposed in the E-field without contacting the conductor and having an input configured to receive a source beam of electro-magnetic radiation and first and second outputs;
    a collimator disposed in the sensor body and configured for collimating the sorce beam;
    a polarization beam displacer disposed in the sensor body and configured for separating the source beam into a first beam of substantially a first polarization orientation and a second beam of substantially a second orthogonal polarization, and for directing the first beam along a first direction and the second beam along a different, second direction;
    polarization altering means disposed in the sensor body and configured for rotating the first polarization of the first beam to a rotated polarization;
    sensing means disposed in the sensor body and configured for inducing a differential phase shift on the major and minor axes of the rotated polarization of the first beam in response to the E-field; and
    redirecting means disposed in the sensor body and configured for redirecting the first beam back through the sensing means, polarization altering means, and polarization beam displacer, and for converting the rotated polarization of the first beam to circular or elliptical polarization; and
    wherein the sensing means is configured for inducing a differential phase shift on the major and minor axes of the circular or elliptical polarization of the first beam;
    the polarization altering means is configured for rotating the major and minor axes of the circular or elliptical polarization of the first beam; and
    the polarization beam displacer is configured for separating the first beam into a third beam representing the major axis of the first beam and a fourth beam representing the minor axis of the first beam, and for directing the third beam along a third direction directly to the first output and the fourth beam along a different, fourth direction directly to the second output.

11. The sensor of claim 10, further comprising:
first collector means disposed at the first output and second collector means disposed at the second output, the first and second collector means being configured for collecting the third and fourth beams respectively.

12. The sensor of claim 11, wherein the first and second collector means each comprise a sleeve, a fiber ferrule disposed in the sleeve, and a graded index lens disposed in the sleeve in contact with the fiber ferrule.

13. A sensor of claim 10, wherein the collimator comprises a sleeve, a fiber ferrule disposed in the sleeve, and a graded index lens disposed in the sleeve in contact with the fiber ferrule.

14. A sensor of claim 10, wherein the polarization beam displacer further is configured to separate the third beam and the fourth beam with a separation angle therebetween which is less than 90 degrees.

15. A sensor of claim 10, wherein the polarization beam displacer has opposite first and second surfaces, and wherein the polarization beam displacer is configured for receiving the source beam at the first surface and passing the first beam through the second surface, and for receiving the first beam back at the second surface and passing the third and fourth beams at the first surface.

16. An electro-optic, voltage sensor system comprising:
a conductor and a grounded conductor configured for producing an E-field therebetween when the conductor is energized;
an elongated sensor body disposed in the E-field between the conductor and the grounded conductor without contacting the conductor, the sensor body having first and second ends, the sensor body also having an input and first and second outputs disposed at the first end of the sensor body;
a transmission source optically coupled to the sensor body configured for producing a source beam of electromagnetic radiation, components of the source beam passing through the sensor body defining a primary optical path, components of the source beam passing from the first end to the second end defining an initial pass, and from the second end to the first end defining a return pass;
a first fiber optic cable having a first end coupled to the transmission source and a second end coupled to the input of the sensor body for optically communicating the source beam from the transmission source to the sensor body;
a graded index lens disposed in the sensor body at the first end and optically coupled to the first fiber optic configured for collimating the source beam as it passes through the lens on the initial pass;
a polarization beam displacer disposed in the sensor body and optically coupled to the graded index lens configured for separating the source beam into a first beam of substantially a first polarization orientation and a second beam of substantially a second orthogonal polarization, and for directing the first beam along a first direction and the second beam along a different, second direction as the source beam passes therethrough on the initial pass, the first beam defining the primary optical path;
a wave plate disposed in the sensor body and optically coupled to the polarization beam displacer configured for rotating the first polarization of the first beam to a rotated polarization as the first beam passes therethrough on the initial pass;
a transducer disposed in the sensor body and optically coupled to the wave plate configured for inducing a differential phase shift on the major and minor axes of the rotated polarization of the first beam in proportion to the magnitude of the E-field as the first beam passes therethrough on the initial pass; and
a reflecting prism disposed in the sensor body generally at the second end and optically coupled to the transducer configured for reflecting the first beam back to the first end of the sensor body defining the return pass and for converting the rotated polarization of the first beam to circular or elliptical polarization; and
wherein the transducer is configured for inducing a differential phase shift on the major and minor axes of the circular or elliptical polarization of the first beam as the first beam passes therethrough on the return pass;
the wave plate is configured for rotating the major and minor axes of the circular or elliptical polarization of the first beam as the first beam passes therethrough on the return pass;
the polarization beam displacer is configured for separating the first beam into a third beam representing the major axis of the first beam and a fourth beam representing the minor axis of the first beam, and for directing the third beam along a third direction directly to the first output and the fourth beam along a different, fourth direction directly to the second output as the first beam passes therethrough on the return pass; and
further comprising a second graded index lens disposed at the first output and a third graded index lens disposed at the second output, the second and third graded index lenses collecting the third and fourth beams respectively.

17. A system of claim 16, wherein the polarization beam displacer is configured for separating and directing the first and second beams with a first separation angle therebetween, the first separation angle being sized such that the second beam is directed towards a side of the sensor body before reaching the reflecting prism.

18. The system of claim 16, wherein the polarization beam displacer is configured for separating and directing the third and fourth beams with a second separation angle therebetween, the second separation angle being less than 90 degrees.

19. The system of claim 16, wherein the polarization beam displacer has opposite first and second surfaces and wherein the source beam enters the polarization beam displacer at the first surface, the first beam exits at the second surface on the initial pass and enters at the second surface on the return pass, and the third and fourth beams exit at the first surface.

20. The system of claim 16, further comprising:
a detector optically coupled to the sensor body by second and third fiber optics coupled between the detector and the first and second outputs, respectively, the detector comprising a first photodetector optically coupled to the first fiber optic and a second photodetector optically coupled to the second fiber optic, for converting the third and fourth beams to electrical signals, the detector further comprising a signal processor for determining a desired E-field characteristic based on the electrical signals.

21. The system of claim 16, wherein the transducer is a Pockels crystal.

22. The system of claim 16, wherein the transducer a material, and wherein the material is MgO-doped $LiNbO_3$.

* * * * *